United States Patent

Chang et al.

[15] 3,649,881

[45] Mar. 14, 1972

[54] HIGH POWER SEMICONDUCTOR DEVICE ASSEMBLY

[72] Inventors: Kern Ko Nan Chang, Princeton; Hans John Prager, Bellemead, both of N.J.

[73] Assignee: RCA Corporation

[22] Filed: Aug. 31, 1970

[21] Appl. No.: 68,371

[52] U.S. Cl. ....................317/234 R, 317/234 A, 317/234 F, 317/234 J, 317/234 M, 317/234 N, 317/234 W, 29/589

[51] Int. Cl. ..........................................H01l 3/00, H01l 5/00

[58] Field of Search ............................317/234; 29/588, 589

[56] References Cited

UNITED STATES PATENTS

| | | | |
|---|---|---|---|
| 3,274,457 | 9/1966 | Wislocky | 317/234 |
| 3,158,927 | 12/1964 | Saunders | 29/155.5 |
| 3,377,206 | 4/1968 | Hanlein et al. | 136/212 |
| 3,476,985 | 11/1969 | Magner et al. | 317/234 |
| 3,333,163 | 7/1967 | Wislocky | 317/234 |

*Primary Examiner*—John W. Huckert
*Assistant Examiner*—Andrew J. James
*Attorney*—Glenn H. Bruestle

[57] ABSTRACT

A high-power semiconductor device assembly wherein a plurality of semiconductor diodes are mounted between opposed, spaced, parallel surfaces of two flat bodies of electrical insulating and good heat conducting material. The opposed surfaces of the bodies have metal films thereon to which the diodes are electrically and mechanically secured. The metal films are arranged to electrically connect the diodes in series. Heat generated in the diodes is conducted through the metal films to the bodies which dissipate the heat to the surrounding ambient.

4 Claims, 6 Drawing Figures

INVENTORS
KERN K. N. CHANG &
HANS J. PRAGER

BY Donald S. Cohen
Attorney

INVENTORS
KERN K. N. CHANG &
HANS J. PRAGER

BY Donald S. Cohen
Attorney

HIGH-POWER SEMICONDUCTOR DEVICE ASSEMBLY

BACKGROUND OF THE INVENTION

The present invention relates to a high power semiconductor device, and more particularly to an assembly of a plurality of semiconductor elements electrically connected in series and having good heat dissipation to obtain efficient high power operation of the assembly.

There have been developed certain semiconductor elements, such as avalanche diodes, which can operate at high powers. Also, it has been found that the powers can be greatly increased by connecting a plurality of the semiconductor elements in series. However, a problem in achieving efficient operation of such semiconductor elements arises from the heat generated by the elements when operated at high powers. Since the semiconductor elements are very small in size, it is necessary to extract relatively large quantities of heat from the elements in order to permit efficient operation of the elements and to prevent thermal destruction of the elements. Therefore any assembly of a plurality of the semiconductor elements must be capable of providing adequate dissipation of heat from the elements. In addition, the assembly should be small in size and easy to fabricate.

SUMMARY OF THE INVENTION

A semiconductor assembly including a pair of bodies of electrical insulating material. The bodies each have a surface and are arranged with their surfaces in directly opposed, spaced, parallel relation. A plurality of semiconductor elements are mounted between the opposed surfaces of the bodies. Electrically conductive means are on the opposed surfaces of the bodies and electrically connect the semiconductor elements in series.

DETAILED DESCRIPTION

Figure 1:
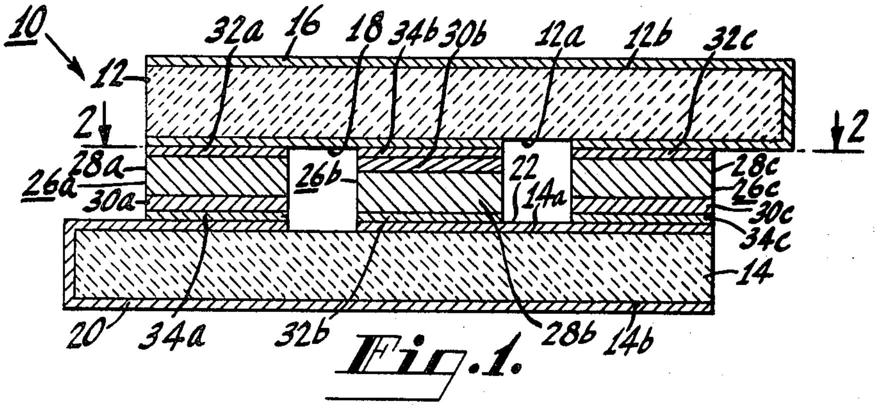
FIG. 1 is a sectional view of one form of the semiconductor device assembly of the present invention.
Figure 2:
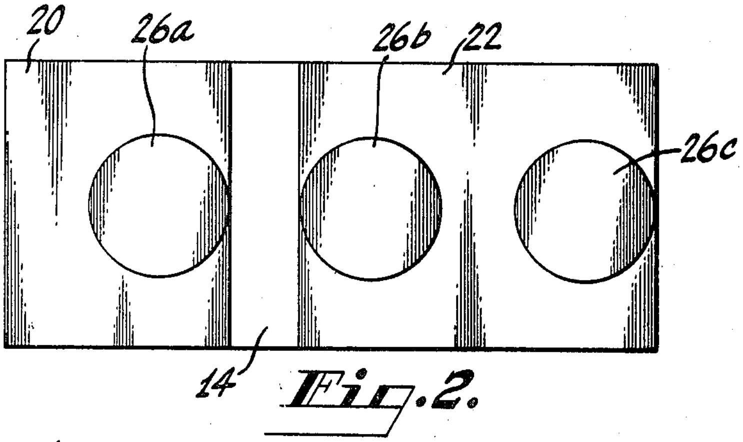
FIG. 2 is a sectional view taken along line 2—2 of FIG. 1.

Referring initially to FIGS. 1 and 2, a form of the semiconductor device assembly of the present invention is generally designated as 10. The semiconductor device assembly 10 comprises a pair of rectangular plates 12 and 14 having flat surfaces 12*a* and 12*b* and 14*a* and 14*b* respectively. The plates 12 and 14 are bodies of an electrical insulating material which is also a good conductor of heat, such as diamond, beryllium oxide or aluminum oxide. A film 16 of an electrically conductive metal, such as silver, gold, or copper, is coated over the entire surface 12b of the plate 12. The metal film 16 extends over an end edge of the plate 12 and partially across the surface 12*a* of the plate 12. A second film 18 of an electrically conductive metal is coated on the surface 12*a* of the body 12 but is spaced from the portion of the metal film 16 on the surface 12*a*. A film 20 of an electrically conductive metal is coated over the entire surface 14*b* of the plate 14. The metal film 20 extends over an end edge of the plate 14 and across a portion of the surface 14*a* of the plate. A second film 22 of an electrically conductive metal is coated on the surface 14a of the plate 14 but is spaced from the portion of the metal film 20 on the surface 14*a*. The plates 12 and 14 are arranged with their surfaces 12*a* and 14*a* in mutually spaced, parallel, and overlapping relation and with the coated end of each plate being adjacent the uncoated end of the other plate.

Three semiconductor elements 26*a*, 26*b* and 26*c* are mounted in the space between the plates 12 and 14. As shown, the semiconductor elements 26*a*, 26*b* and 26*c* are diodes and comprise a flat circular body of a semiconductor material, such as silicon, germanium or a III-V compound semiconductive material, having regions 28*a*, 28*b* and 28*c* respectively of N type conductivity across one surface thereof and thin regions 30*a*, 30*b* and 30*c* respectively of P type conductivity across the other surface thereof. The P type regions 30*a*, 30*b* and 30*c* are contiguous with the N type regions 28*a*, 28*b* and 28*c* respectively to provide PN junctions therebetween. Contact films 32*a*, 32*b* and 32*c* are coated on the surfaces of the N type regions 28*a*, 28*b* and 28*c* respectively, and contact films 34*a*, 34*b* and 34*c* are coated on the surfaces of the surfaces of the P type regions 30*a*, 30*b* and 30*c* respectively. The contact films are of an electrically conductive metal, such as chromium or titanium which may be coated with gold, and are in ohmic contact with the respective regions of the semiconductor elements 26*a*, 26*b* and 26*c*.

The semiconductor element 26*a* is positioned between the second metal film 18 on the plate 12 and the portion of the metal film 20 on the surface 14*a* of the plate 14 with the N type region contact 32*a* engaging the second metal film 18 and the P type region contact 34*a* engaging the metal film 20. The semiconductor element 26*b* is positioned between the second metal film 18 on the plate 12 and the second metal film 22 on the plate 14 with the P type region contact 34*b* engaging the second metal film 18 and the N type region contact 32*b* engaging the second metal film 22. The semiconductor element 26*c* is positioned between the portion of the metal film 16 on the surface 12*a* of the plate 12 and the second metal film 22 on the plate 14 with the N type region contact 32*c* engaging the metal film 16 and the P type region contact 30*c* engaging the second metal film 22. Then contacts of the semiconductor elements are bonded to the metal films that they engage, such as by soldering, ultrasonic bonding or thermal compression bonding.

The electrical path from the metal film 16 on the plate 12 to the metal film 20 on the plate 14 is first through the semiconductor element 26*c* from the N type region contact 32*a* to the P type region contact 30*c*, then along the second metal film 22 to the semiconductor element 26*b*, then through the semiconductor element 26*b* from the N type region contact 32*b* to the P type region contact 30*b*, then along the second metal film 18 to the semiconductor element 26*c*, and then through the semiconductor element 26*a* from the N type region contact 32*a* to the P type region contact 30*a*. Thus, the semiconductor elements 226*a*, 26*b* and 26*c* are electrically connected in series with the metal films 16 and 20 being the terminals of the assembly. In addition, each of the semiconductor elements 26*a*, 26*b* and 26*c* is individually thermally connected to both of the plates 12 and 14. Thus, heat generated in the semiconductor elements 26*a*, 26*b* and 26*c* is conducted from each of the semiconductor elements in two directions directly to both of the plates 12 and 14. Since the plates 12 and 14 are of a good heat conducting material and are of a larger mass than the semiconductor elements, the plates conduct the heat from the semiconductor elements and dissipate the heat to the ambient so as to maintain the semiconductor element at a relatively low temperature. Thus the semiconductor device assembly 10 includes a plurality of semiconductor elements electrically connected in series and provides good heat conduction from the semiconductor elements to permit efficient operation of the semiconductor elements at high power levels.

Although the semiconductor elements are shown and described as diodes having two contiguous regions of opposite conductivity type, they can be any type of semiconductor element having two contacts at opposite surfaces of a body of semiconductor material. For example, the semiconductor element may be of the type similar to the semiconductor elements 26*a*, 26*b* and 26*c* but with a third region over either the P type region or the N type region of the same conductivity type but of a lower resistivity, such as an N+NP diode or a P+PN diode, or could have an intrinsic region between the P type region and N type region, such as P - I - N diode. Also, the semiconductor elements can be transferred electron effect diodes, commonly called Gunn diodes, or Schottky barrier junction diodes. In addition, although the semiconductor assembly 10 is shown as having three semiconductor elements it can include any desired number of additional semiconductor elements.

Figures 3, 4:
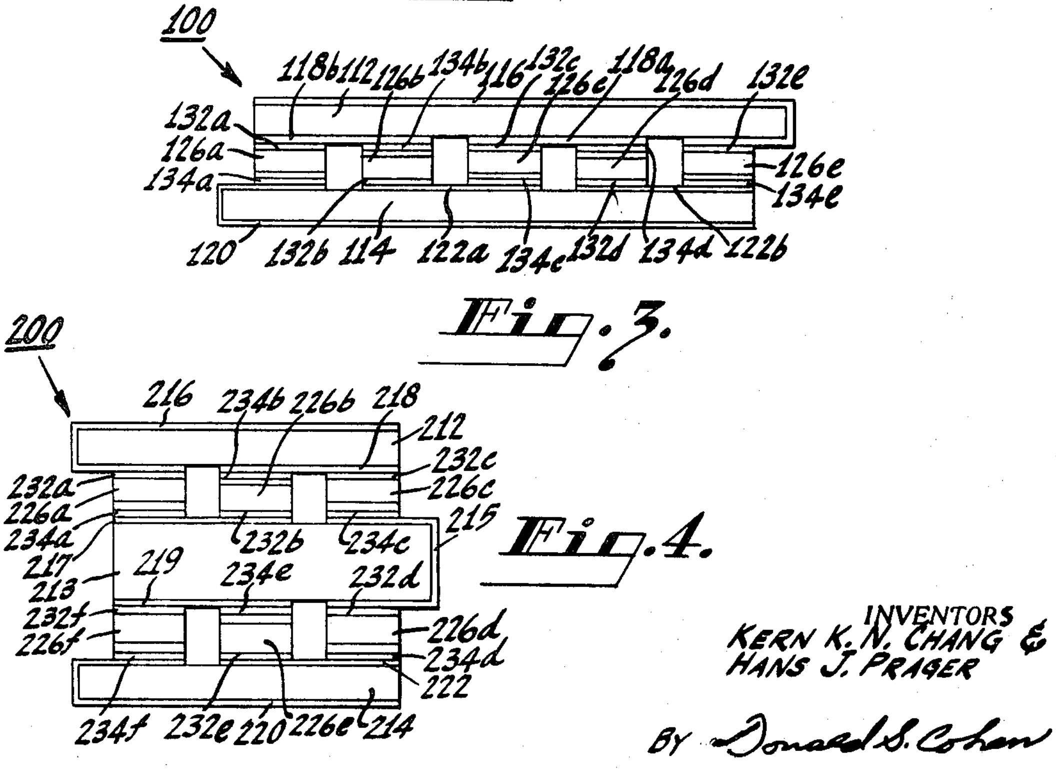
FIG. 3 is an edge plan view of another form of the semiconductor device assembly.
FIG. 4 is an edge plan view of still another form of the semiconductor device assembly.

Referring to FIG. 3 there is shown another form of the semiconductor device assembly, generally designated as 100, which includes five semiconductor elements 126*a*, 126*b*, 126*c*, 126*d* and 126*e*. The semiconductor device assembly 100 comprises a pair of flat, rectangular plates 112 and 114 arranged in spaced, parallel, superimposed relation. The plates 112 and 114 are bodies of an electrical insulating material which is also a good conductor of heat. Electrically conductive metal films 116 and 120 are coated on the outer surfaces of the plates 112 and 114 respectively. The metal films 116 and 120 extend around an end edge of the respective plates and over a portion of the opposed surfaces of the plates. Two additional electrically conductive metal films 118*a* and 118*b* are coated in spaced relation on the opposed surface of the plate 112 and two additional electrically conductive metal films 122*a* and 122*b* are coated in spaced relation on the opposed surface of the plate 114.

The semiconductor elements 126*a*–126*e*, as shown, are diodes of the same construction as the semiconductor elements 26*a*, 26*b* and 26*c* of the semiconductor device assembly 10 of FIG. 1. The semiconductor elements 126*a*–126*e* are mounted between plates 112 and 114 with their metal contacts 132*a*–132*e* and 134*a*–134*e* engaging and secured to respective ones of the metal films on the opposed surfaces of the plates 112 and 114. The N type region contact 132*a* of the semiconductor element 126*a* engages the metal film 118*b* on the plate 112 and the P type region contact 134*a* of the semiconductor element 126*a* engages the metal film 120 on the plate 114. The P type region contacts 134*b* and the N type region contacts 132*b* of the semiconductor element 126*b* engages the metal film 118*b* on the plate 112 and the metal film 122*a* on the plate 114 respectively. The semiconductor element 126*c* is positioned with its N type region contact 132*c* engaging the metal film 118*a* on the plate 112 and its P type region contact 134*c* engaging the metal film 122*a* on the plate 114. The P type region contact 134*d* and the N type region contact 132*d* of the semiconductor element 136*d* engage the metal film 118*a* on the plate 116 and the metal film 122*b* on the plate 114 respectively. The N type region contact 132*e* and the P type region contact 134*e* of the semiconductor element 126*e* engage the metal film 116 on the plate 116 and the metal film 122*b* on the plate 114 respectively. Thus, the semiconductor elements 126*a*–126*e* are electrically connected in series between the metal films 116 and 120. In addition, each of the semiconductor elements 126*c*–126*e* is individually thermally connected to both the plates 116 and 114 so as to achieve good conduction of heat away from the semiconductor elements for efficient operation of the semiconductor elements at high power levels. An additional pair of semiconductor elements can be mounted between the plates by extending the length of the plates and providing a further addition of the metal film on the opposing surfaces of each plate for each additional pair of semiconductor elements. Thus, any odd number of the semiconductor elements can be mounted between the plates where electrical contact to the assembly is to be made at opposite sides of the assembly on the outer surfaces of the plates. However, an even number of the elements can be mounted between the plates by having the metal films connected to the elements extend to the outer surface of the same plate so that the electrical contact to the assembly is made on one side thereof.

Figure 5:
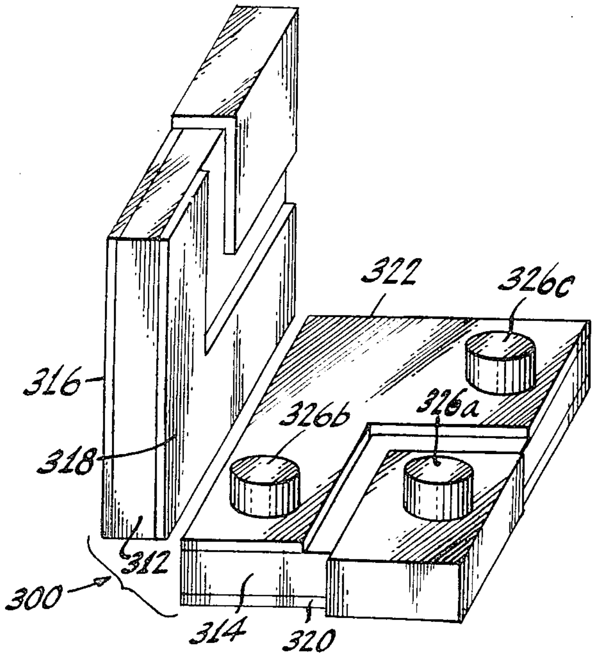
FIGS. 5 and 6 are exploded perspective views of additional forms of the semiconductor device assembly.

Referring to FIG. 5, there is shown still another form of the semiconductor device assembly, generally designated as 200, which includes six semiconductor elements 226*a*–226*f*. The semiconductor device assembly 200 comprises three flat, rectangular plates 212, 213 and 214 arranged in spaced, parallel, superimposed relation. The plates 212, 213 and 214 are bodies of an electrical insulating material which is also a good conductor of heat. The plates 212 and 214 are coated on their outer surfaces with electrically conductive metal films 216 and 220 respectively. The metal films 216 and 220 extend across an end edge of their respective plates and across a portion of the surfaces of the plates which are opposed to the plate 213. An additional electrically conductive metal film 218 is coated on the opposed surface of the plate 212 and is spaced from the metal film 216, and an additional electrically conductive metal film 222 is coated on the opposed surface of the plate 214 and is spaced from the metal film 220. The plate 213 has an electrically conductive metal film 215 coated thereon which extends over a portion of one surface adjacent one end of the plate across the end edge of the plate and across a portion of the other surface of the plate. Additional electrically conductive metal films 217 and 219 are coated on the surfaces of the plate 213 and are spaced from the metal film 215. The plate 213 is positioned with its coated end being adjacent the uncoated ends of the plates 212 and 214.

The semiconductor elements 226*a*–226*f*, as shown, are diodes of the same construction as the semiconductor elements 26*a*, 26*b* and 26*c* of the semiconductor device assembly 10 of FIG. 1. The semiconductor elements 226*a*, 226*b* and 226*c* are mounted between the plates 212 and 213 with their metal contacts 232*a*, 232*b*, 232*c*, 234*a*, 234*b* and 234*c* engaging and secured to respective ones of the metal films on the opposed surfaces of the plates 212 and 213. The semiconductor element 226*a* is positioned with its N type region contact 232*a* and its P type region contact 234*a* engaging respectively the metal film 216 on the plate 212 and the additional metal film 217 on the plate 213. The semiconductor element 226*b* is positioned with its P type region contact 234*b* and its N type region contact 232*b* engaging respectively the additional metal film 218 on the plate 212 and the additional metal film 217 on the plate 213. The semiconductor element 226*c* is positioned with its N type region contact 232*c* and its P type region contact 234*c* engaging respectively the additional metal film 218 on the plate 212 and the metal film 215 on the plate 213.

The semiconductor elements 226*d*, 226*e* and 226*f* are mounted between the plates 214 and 213 with their metal contacts 232*d*, 232*e*, 232*f*, 234*d*, 234*e* and 234*f* engaging and secured to respective ones of the metal films on the opposed surfaces of the plates 214 and 213. The semiconductor element 226*d* is positioned with its P type region contact 234*d* and its N type region contact 232*d* engaging respectively the additional metal film 222 on the body 214 and the metal film 215 on the body 213. The semiconductor element 226*e* is positioned with its N type region contact 232*e* and its P type region contact 234*e* engaging respectively the additional metal film 222 on the body 214 and the additional metal film 219 on the body 213. The semiconductor element 226*f* is positioned with its P type region contact 234*f* and its N type region contact 232*f* engaging respectively the metal film 220 in the body 214 and the additional metal film 219 on the body 213.

Thus, the semiconductor elements 226*a*–226*f* are electrically connected in series between the metal film 216 on the plate 212 and the metal film 220 on the plate 214. In addition, each of the semiconductor elements is individually thermally connected to two of the plates so as to achieve good conduction of heat away from the semiconductor elements for efficient operation of the semiconductor elements at high power levels. Since the middle plate 213 has all of the semiconductor elements thermally connected thereto, whereas each of the outer plates 212 and 214 has only three of the semiconductor elements thermally connected thereto, the middle plate 213 may be made thicker than the outer plates 212 and 214, as shown in FIG. 4, so as to ensure good heat conduction from all of the semiconductor elements. Also, the semiconductor device assembly 200 may be provided with additional pairs of the semiconductor elements between the opposed plates by extending the length of the plates and providing additional metal films on the opposed surfaces of the plates in the manner shown in the semiconductor device assembly 100 of FIG. 3.

Although the semiconductor device assembly has been shown in FIGS. 1, 3 and 4 are having rectangular plates with the semiconductor elements being positioned in a straight alignment between the plates, the plates can be of any desired shape with the semiconductor elements arranged in any desired relation between the plates. For example, in FIG. 5 there is shown a semiconductor device assembly 300 in which the plates 312 and 314 are square. The metal films 316 and 320 coated on the outer surfaces of the plates 312 and 314 respectively extend across the edge of the plates at a corner thereof and over a corner portion of the opposed surfaces of the plates. The additional metal films 318 and 322 are coated on the remaining portions of the opposed surfaces of the plates 312 and 314 respectively except for the space between the additional metal films 318 and 322 and the metal films 316 and 320 respectively. The semiconductor elements 326*a*, 326*b* and 326*c* are mounted between the plates 312 and 314 at substantially the corners of the opposed surfaces of the plates. The semiconductor elements 326*a*, 326*b* and 326 *c* are mechanically and electrically connected to the metal films on the opposed surfaces of the plates 312 and 314 so that the semiconductor elements are electrically connected in series between the metal films 316 and 320.

Figure 6:
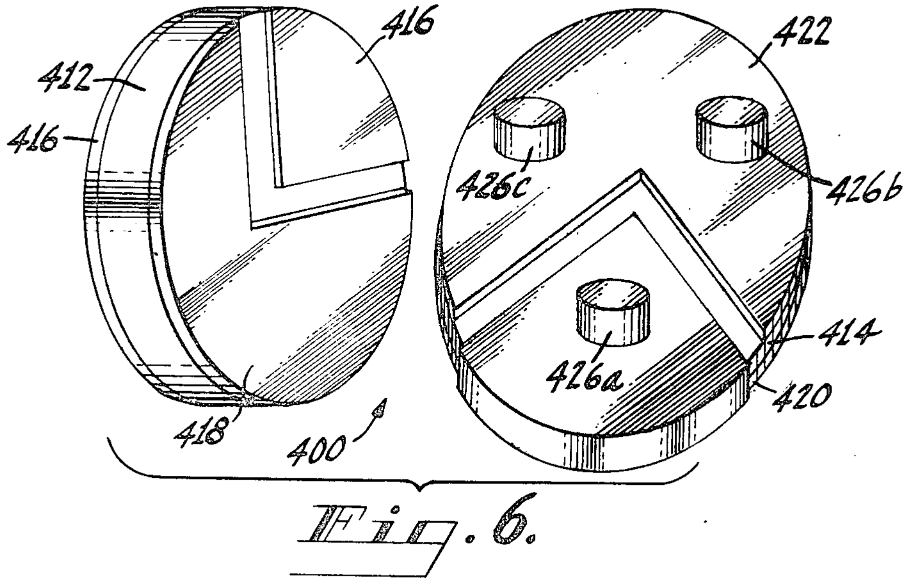

Referring to FIG. 6 there is shown a semiconductor device assembly 400 having a pair of circular plates 412 and 414. The metal films 416 and 420 coated on the outer surfaces of the plates 312 and 314 respectively extend across a portion of the edge of the respective plates and over a small section of the opposed surfaces of the plates. The additional metal films 418 and 422 are coated on the remaining portions of the opposed surfaces of the plates 412 and 414 respectively except for the spaces between additional metal films 418 and 422 and the metal films 416 and 420 respectively. The semiconductor elements 426*a*, 426*b* and 426*c* are mounted between the plates 412 and 414 at circumferentially spaced positions on the opposed surfaces of the plates. The semiconductor elements 426*a*, 426*b* and 426*c* are mechanically and electrically connected to the various metal films on the opposed surfaces of the plates 412 and 414 so that the semiconductor elements are electrically connected in series between the metal films 416 and 420.

The semiconductor device assembly of the present invention may be provided with a larger number of the semiconductor elements by stacking together two or more of either the assemblies 10 of FIG. 1, the assemblies 100 of FIG. 3, the assemblies 200 of FIG. 4, the assemblies 300 of FIG. 5, the assemblies 400 of FIG. 6 or combinations of these assemblies. Thus, the semiconductor device assembly of the present invention can be provided with any desired number of the semiconductor elements electrically connected in series and thermally connected to the plates for good conduction of the heat away from the semiconductor elements so that the assembly can be efficiently operated at high power levels.

We claim:

1. A semiconductor assembly comprising: directly a pair of bodies of electrical insulating material each having a pair of spaced parallel flat surfaces, said bodies being arranged with one of said surfaces of one of the bodies being in directly opposed, spaced parallel relation to one of said surfaces of the other body;

an odd number of semiconductor elements mounted between said one surfaces of the bodies each of said semiconductor elements including a body of semiconductor material having opposed end surfaces and a metal contact film on each of said ends surfaces; and spaced films of an electrically conductive metal on each of said one surfaces of the bodies electrically connecting said semiconductor element in series, each metal film on each of said one surfaces except one of the metal films being bonded to the metal contact film of two of the semiconductor elements, and the one metal film on each of said one surfaces being bonded to the metal contact film of a separate one of the semiconductor elements which is at an end of the series connection, and each of said one metal films extending across an edge of its respective body and over the other said surface of the body to serve as terminals for the assembly.

2. A semiconductor assembly in accordance with claim 1 in which the bodies are of a good heat conducting material and each of the semiconductor elements is thermally connected to both of the bodies.

3. A semiconductor assembly in accordance with claim 2 including a third body of an electrical insulating material which is a good conductor of heat mounted between said pair of bodies, said third body having a pair of surfaces each of which is directly opposed spaced, parallel relation with a separate one of said one surfaces of the pair of bodies, an odd number of semiconductor elements mounted between each pair of opposed surfaces of said bodies, and spaced films of an electrically conductive metal on each of said surfaces of the third body, the metal films on said bodies electrically connecting all of the semiconductor elements in series.

4. A semiconductor assembly in accordance with claim 1 in which each metal film on each surface of said third body except one of the metal films is electrically connected to two of the semiconductor elements, the one metal film on each of the surfaces of the third body is electrically connected to a separate one of the semiconductor elements, and the one metal film on each surface of the third body are electrically connected together.

* * * * *

UNITED STATES PATENT OFFICE
CERTIFICATE OF CORRECTION

Patent No. 3,649,881 Dated March 14, 1972

Inventor(s) Kern Ko Nan Chang & Hans John Prager

It is certified that error appears in the above-identified patent and that said Letters Patent are hereby corrected as shown below:

Column 2, line 46, change "226a" to --26a--.

Column 6, line 6, delete "directly".

Signed and sealed this 15th day of August 1972.

(SEAL)
Attest:

EDWARD M. FLETCHER, JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334